United States Patent [19]
Bodager et al.

[11] Patent Number: 5,532,115
[45] Date of Patent: Jul. 2, 1996

[54] PROCESS FOR FORMING A COLORED IMAGE UTILIZING A NON-PHOTOSENSITIVE/PHOTOSENSITIVE COMBINATION

[75] Inventors: Gregory A. Bodager, Monroeton, Pa.; Phillip L. Beighle, Colts Neck, N.J.

[73] Assignee: E. I. Du Pont de Nemours and Company, Wilmington, Del.

[21] Appl. No.: 315,738

[22] Filed: Sep. 30, 1994

[51] Int. Cl.[6] ............................................. G03C 5/00
[52] U.S. Cl. .......................... 430/325; 430/293; 430/257; 430/358; 430/394
[58] Field of Search .................................. 430/325, 293, 430/257, 358, 394

[56] References Cited

U.S. PATENT DOCUMENTS

| | | | |
|---|---|---|---|
| 4,272,620 | 6/1981 | Ichimura | 525/61 |
| 4,737,436 | 4/1988 | Thompson | 430/143 |
| 5,094,931 | 3/1992 | Platzer | 430/258 |
| 5,213,941 | 5/1993 | Platzer | 430/256 |
| 5,443,937 | 8/1995 | Bodager et al. | 430/143 |

FOREIGN PATENT DOCUMENTS

| | | |
|---|---|---|
| 1-116540 | 5/1989 | Japan . |
| 1-116539 | 5/1989 | Japan . |
| WO92/02857 | 2/1992 | WIPO . |

OTHER PUBLICATIONS

International Publication No. WO 92/02857, published Feb. 20, 1990, International Appln. No. PCT/US91/05387, International Filing Date Jul. 30, 1991, Inventors—Gregory Allen Bodager et al.

*Primary Examiner*—George F. Lesmes
*Assistant Examiner*—Laura Weiner

[57] ABSTRACT

A process for forming a colored image comprising, in order: (a) applying at least one aqueous permeable colorant-containing composition to a photosensitive element comprising a permanent carrier element having a carrier surface, and an unpigmented, first photosensitive layer consisting essentially of an aqueous liquid developable photosensitive composition, wherein the aqueous permeable colorant-containing composition is applied to the unpigmented, first photosensitive layer; (b) imagewise exposing to actinic radiation the photosensitive element having applied thereon the permeable colorant-containing composition to form imagewise exposed and unexposed regions in the unpigmented, first photosensitive layer and the overlying permeable colorant-containing composition; and (c) developing the exposed element by washing with an aqueous liquid, thereby removing either the imagewise exposed or imagewise unexposed regions, to produce a first colored pattern is described.

17 Claims, 2 Drawing Sheets

PROCESS FOR FORMING A COLORED IMAGE UTILIZING A NON-PHOTOSENSITIVE/PHOTOSENSITIVE COMBINATION

FIELD OF THE INVENTION

This invention relates to the formation of colored images. In particular, this invention relates to the formation of a colored image using an unpigmented photosensitive element comprising a permanent support and a colorant-containing composition.

BACKGROUND OF THE INVENTION

Photosensitive elements which can be used in image-reproduction processes are well-known in the graphics arts industry. Such elements are usually exposed to actinic radiation through an image-bearing transparency, such as a color separation transparency, to produce an image which is either a positive or negative with respect to the transparency used.

Such photosensitive elements are widely used in off-press color proofing to simulate the images produced by printing. In a surprint proof, all of the colored images are superposed, by, for example, multiple exposure, lamination, or transfer, on a single support. The colored images cannot be separated and viewed individually. In an overlay proof, the colored images can be viewed individually.

Positive-working photopolymerizable elements are described in Chu and Cohen, U.S. Pat. No. 3,649,268 and negative-working photosensitive elements are described in Cohen and Fan, U.S. Pat. Nos. 4,174,216 and 4,191,572. The image is developed by toning with a suitable toner which desirably adheres only in the tacky image areas. Excess toner which may be present is removed from the non-tacky image areas to provide, for example, an image which is a proof of an original or which can be used to transfer the image to another surface. Toning provides color flexibility but is associated with environmental concerns because the fine powders are difficult to handle. Also, use of toners results in images having significant relief so that it is difficult to obtain high resolution images when it is necessary to superimpose images to make multicolored images.

Precolored wash-off systems are known in the art. These include precolored diazo based imaging systems such as Van Beusekom, U.S. Pat. No. 3,671,236; Cederburg, U.S. Pat. No. 4,656,114; and Sachi, U.S. Pat. No. 4,666,817 which are developed in a mixture of water and 1-propanol; Krech, U.S. Pat. No. 4,260,673 which is developed in base; and Platzer, U.S. Pat. No. 4,751,166, Mino, U.S. Pat. No. 4,783,390 and Adolphson et al., U.S. Pat. No. 5,075,722 which are developed in water. These systems provide improved resolution. However, since the elements are precolored, color flexibility is limited because preparation of the precolored elements in all the desired colors is not economically feasible. An additional drawback for the systems that are developed in an aqueous base one organic solvent is that they can pose flammability, toxicity, corrosion and/or waste disposal concerns.

Thompson, U.S. Pat. No. 4,737,436 discloses a water based method for making color proof images on a single substrate using a photoresist coating containing a pigment blend. The process provides for the blending of pigments, followed by (a) the combining of the pigment blend with a water soluble photoresist composition, (b) coating a substrate with the photoresist containing the pigment blend, (c) imagewise exposing, and (d) developing to produce an image on the substrate. A second image is then formed on the exposed and developed substrate by forming a second pigment blend, followed by the combining of the second pigment blend with a water soluble photoresist composition, coating the substrate having the first image with the photoresist containing the second pigment blend, imagewise exposing and developing to produce a second image on the substrate.

The process disclosed by Thompson has several disadvantages. Coating solution stability problems have been observed when the pigment blend is combined with photoresist coating. Coating non-uniformity problems can result, with uniform coating becoming increasingly difficult, as the size of the work increases. Since the pigment blend is mixed with the photoresist prior to coating, compatiblity of the pigment with the photoresist coating becomes an issue. This process is also limited in that it does not provide for the application of colorant to the approximate image areas only.

A need exists for a process that generates a high resolution, high quality color image. Further, a need exists for a process that provides color flexibility without the environmental concerns associated with the prior art systems. A need also exists for a process that provides for the application of the colorant to the approximate image areas only.

SUMMARY OF THE INVENTION

This invention provides a process for forming a colored image comprising, in order:

(A) applying at least one aqueous permeable colorant-containing layer to a photosensitive element comprising, in order,
  (1) a permanent carrier support that is resistant to aqueous liquid development,
  (2) a carrier surface selected from the group consisting of (i) a surface treated to promote adhesion, (ii) an anchor layer, and (iii) combinations thereof,
  (3) an unpigmented, first photosensitive layer consisting essentially of an aqueous liquid developable photosensitive composition, wherein the aqueous permeable colorant-containing layer is in contact with the first photosensitive layer;

(B) imagewise exposing to actinic radiation the photosensitive element from step (A) having applied thereon the permeable colorant-containing layer;

C) developing the exposed element from step (B) by washing with an aqueous liquid, thereby removing either the imagewise exposed or imagewise unexposed regions, to produce a first colored pattern.

The permanent carrier support in the photosensitive element may be transparent or opaque.

Optionally, this process can be employed to form a multi-colored image by adding, in order, after step (C) the following steps:

(C1) laminating to the element from step (C), an unpigmented element,
  (1) an additional support,
  (2) an underlying additional photosensitive layer comprising,
    (a) at least one aqueous liquid developable, unpigmented, photosensitive composition, and
  (3) an underlying additional adhesive layer; wherein the additional adhesive layer is adjacent to and overlying the first colored pattern in the element from step (C);

(C2) removing said additional support;

(C3) applying at least one aqueous permeable colorant-containing composition to the additional photosensitve layer;

(C4) imagewise exposing to actinic radiation said additional photosensitive layer and the aqueous permeable colorant-containing composition in register with the previously formed first colored pattern to form imagewise exposed and imagewise unexposed regions;

(C5) developing said exposed additional photosensitive layer and the aqueous permeable colorant-containing composition from step (C4) by washing with an aqueous liquid, thereby removing either the imagewise exposed or imagewise unexposed regions, to produce an additional colored pattern; and optionally, (C6) repeating, in order, steps (C1) to (C5) one or more times; wherein the adhesion force between the permanent carrier support and said carrier surface has a value of F1; the adhesion force between said carrier surface and said first colored pattern has a value of F2; wherein the adhesion force between said adhesive layer and said underlying first colored pattern has the value F3; the adhesion force between any of said additional adhesive layers and the underlying additional colored pattern has the value F3i; the adhesion force between any of said additional adhesive layers and the overlying additional colored pattern has the value F2i; the adhesion force between the additional adhesive layer and the overlying additional photosensitive layer prior to exposure to actinic light has the value F4; the adhesion force between the additional photosensitive layer prior to exposure to actinic light and the overlying additional support has the value F5; and wherein each of F1, F2, F3, F2i, F3i, and F4 is greater than F5.

In a preferred embodiment (a) the liquid for development is water, (b) the photosensitive material is an aqueous-processable derivative of polyvinyl alcohol containing photocrosslinkable groups selected from the group consisting of N-alkyl styrylpyridinium and N-alkyl styrylquinolinium, and (c) the aqueous colorant-containing composition is an ink jet ink and is printed on the unpigmented, photosensitive layer using an ink jet printer.

DETAILED DESCRIPTION OF THE INVENTION

In one embodiment of the invention, a single colored image on a permanent support is formed by applying at least one aqueous permeable colorant-containing composition to a photosensitive element. The photosensitive element contains a permanent carrier element having a carrier surface and an unpigmented, first photosensitive layer consisting essentially of an aqueous, liquid developable photosensitive composition. The aqueous permeable colorant-containing composition is applied to the photosensitive layer and then imagewise exposed to actinic radiation to form imagewise exposed and unexposed regions in the unpigmented, first photosensitive layer and the overlying permeable colorant-containing composition. The exposed element is then developed by washing with an aqueous liquid, thereby removing either the imagewise exposed or imagewise unexposed regions, to produce a first colored pattern. When the permanent carrier element is transparent, the resulting element can be used to prepare a multicolor overlay.

In another embodiment of this invention, the permanent carrier element is used to build up a multicolored image consisting of multiple imaged color layers, each interleaved and bonded together with an adhesive layer. Multiple color images are built up on the permanent carrier element by executing multiple imaging steps, respectively.

This invention provides for high resolution, high quality overlay proofs or surprint proofs without the need for a transfer step. It provides for development during imaging with tap water to minimize or eliminate environmental and safety concerns such as toxicity, waste treatment, and corrosion. This invention also provides for color flexibility. It also allows for the addition of the colorant-containing composition only to the approximate areas where an image is desired. It also provides for the addition of more than one color to a single layer.

In practicing the process of the invention, at least two components are necessary: (I) a photosensitive element comprising a permanent carrier element having a carrier surface and an unpigmented photosensitive layer, and (II) an aqueous permeable colorant-containing composition. When the permanent carrier element is transparent, the resulting element can be used to prepare an overlay. The permanent carrier element having a carrier surface may comprise a permanent carrier support which has been surface treated to promote adhesion or a carrier support (14) and an anchor or adhesive layer (15). Additional photosensitive elements and additional colorant-containing compositions are also used in making multicolor images.

PHOTOSENSITIVE ELEMENT

Figure 1:
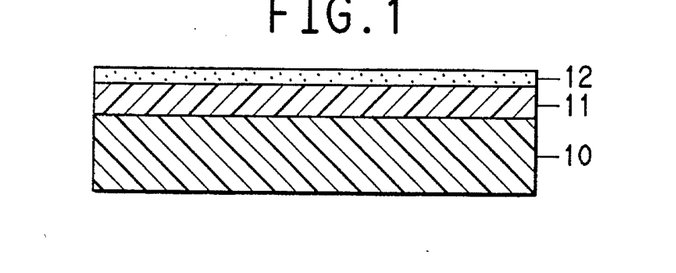
FIG. 1 is a schematic illustration of the photosensitive element used in the process of the invention having applied thereon at least one aqueous permeable colorant-containing composition.

The unpigmented photosensitive element with an overlying aqueous permeable, colorant containing composition (12) is shown in FIG. 1. The element comprises, in order, a permanent carrier element having a carrier surface (10) and an unpigmented photosensitive layer (11).

Figure 2:
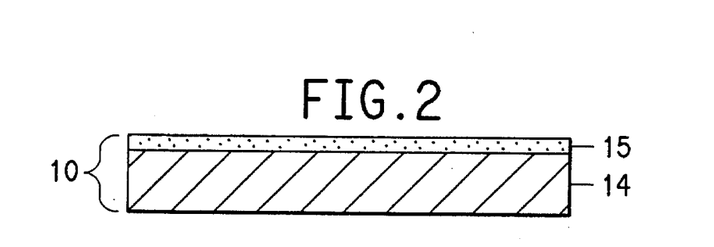
FIG. 2 is a schematic illustration of one embodiment of the carrier element and carrier surface used in the process of the invention.

Carrier Element:

The permanent carrier element having a carrier surface (10) may comprise a permanent carrier support (14) which has been surface treated to promote adhesion or a permanent carrier support (14) and an anchor or adhesive layer (15).

The permanent carrier support (14) can comprise almost any material which has reasonable stiffness, has dimensional stability, and is water, heat, and pressure resistant to withstand the various lamination steps. Materials with sufficient stiffness and dimensional stability are those which are capable of supporting an image without allowing it to shift and misalign. The material used for the carrier support should have enough water resistance to allow for aqueous development of the photosensitive layer without warping or shrinking. The support is generally smooth and flat. Examples of suitable materials which can be used include polymeric films such as polyesters, including polyethylene terephthalate and polyethylene naphthanate; polyamides; polycarbonates; fluoropolymers; polyacetals; polyolefins; etc. The carrier support can also be a thin metal sheet or a paper substrate or synthetic paper which has been treated to be water resistant. The carrier support can be transparent, translucent or opaque. When the process of the invention is used to prepare an overlay proof, the permanent carrier support (14) is transparent. It can be colored and can have incorporated materials such as antihalation dyes, matting agents, etc. Polyethylene terephthalate film is a preferred carrier support material for an overlay proof. A paper support that has been treated to be water, heat and pressure resistant is a preferred carrier support material for a surprint.

The carrier support can have an antistat layer coated on one or both sides. It is generally preferred to have an antistat layer coated on the back side of the carrier support, i.e., the side opposite from that on which the photosensitive layer is present. Materials which can be used as antistat materials are well known in the art.

The carrier support typically has a thickness of about 20 to about 250 micrometers (1.0 to 10 mils). A preferred thickness is about 55 to 200 micrometers (2 to 8 mils).

For most proofing applications, a paper support that has been treated to be water, heat and pressure resistant is used; and is preferably the same paper on which the image will ultimately be printed. Virtually any paper stock can be used. Other materials which can be used as the permanent carrier support include cloth, wood, glass, china, most polymeric films, synthetic papers, thin metal sheets or foils, etc. Almost any material which will adhere to the photosensitive layer (11) or the anchor or adhesive layer (15) can be used as the permanent carrier support. If the material used as the permanent carrier support has been treated to promote adhesion, e.g., ED treated polyethylene terephthalate, no additional surface layer may be needed. The carrier surface layer (15) should have sufficient adhesion to the carrier support (14) to remain affixed to that support throughout all the process steps in the processes of the invention. The carrier surface layer should have sufficient adhesion to the unpigmented photosensitve layer to remain affixed thereto during aqueous development of the photosensitive layer.

The permanent carrier element having a carrier surface (10) may also have an image adjacent its carrier surface over which the photosensitive layer (11) is applied. This image may be provided by any method known to one skilled in the art.

To ensure adequate adhesion of the unpigmented layer to the permanent carrier support, it is sometimes necessary to include one or more anchor layers between them. By "anchor layer" it is meant a layer that remains adhesively bonded to the layers on both sides, i.e., the layer above it and the layer below it. The anchor or adhesive layer (15) remains affixed to the photosensitive layer throughout the process of the invention. This layer can comprise any suitable composition which has the necessary adhesion to the photosensitive layer and which does not interfere with the function of the photosensitive layer. For example, materials that cause leaching of components from the anchor layer into the photosensitive layer or the resulting imaged layer would not be acceptable. Also the adhesive materials should not be adversely affected by the aqueous development step. To provide a high resolution image, it is preferred that the adhesive layer be capable of holding onto a dot during processing; not stain the pigmented layer; and not block to other layers, e.g. paper, etc., both during and after proof assembly. Preferably, the adhesive layer is transparent and contains no yellowness which may shift the color balance. It should be capable of easy lamination without trapping air bubbles which reduce image quality. It is preferred that the adhesive layer be capable of sliding easily over other layers, but not so easily that registration problems occur. The adhesive layer should, preferably, (a) heat seal to other color films and adhesive layers, (b) be scratch and abrasion resistant, in wet or dry form, and (c) not crack or become brittle over time, or when folded, bent, etc. Sticking to components of the lamination or processing equipment is also undesirable.

Adhesive materials for bonding different types of materials are well known in the art and discussions can be found in, e.g., *Handbook of Adhesives, 2nd Edition*, Irving Skeist, Ed. (Van Nostrand Reinhold Co., New York, 1977). Suitable materials for use as the carrier anchor layer include, for example, polyester resins, ethylene/vinyl acetate copolymers; vinyl chloride/vinyl acetate copolymers; vinyl chloride/vinylidene chloride copolymers; thermoplastic polyamides; and the like. The exact choice of adhesive will depend on the compositions of the unpigmented photosensitive layer, the permanent carrier support and optionally the carrier cushion layer, if present. The anchor layer or layers can have incorporated therein materials such as antistats, colorants, antihalation dyes, optical brighteners, surfactants, plasticizers, coating aids, and the like.

The carrier anchor layer generally has a thickness in the range of 0.01 to 10 micrometers; preferably 0.05 to 5 micrometers and more preferably 0.5 to 3 micrometers. When more than one anchor layer is present, the total thickness of the layers is generally in the above range.

A cushion layer (not shown) may be present between the carrier surface layer (15) and the permanent carrier support; (14). The cushion layer is a deformable layer. Surprisingly, it was found that the incorporation of a carrier cushion layer on the carrier support resulted in several advantages in the process of the invention when forming multicolor images. For example, the amount of mottle caused by incorporation of entrapped air during lamination steps was greatly reduced; lamination temperatures could be reduced; and the adhesion between colors was improved. Some examples of suitable materials which can be used as the carrier cushion layer include ethylene/methacrylic acid copolymers and ionomers; ethylene/acrylic acid copolymers and ionomers; ethylene/vinyl acetate copolymers; ethylene homopolymers; propylene homopolymers; ethylene/propylene copolymers; ethylene/methacrylate copolymers; ethylene/methacrylic acid/isobutylacrylic acid ionomers; and the like. Mixtures of materials can also be used. Preferred materials for the carrier cushion layer are ethylene/methacrylic acid and ethylene/acrylic acid copolymers and ionomers. Such materials are commercially available as, e.g., Surlyn® 1601 (E. I. du Pont de Nemours and Company, Wilmington, Del.) and Iotek®4080 (Exxon Chemical Co., Houston, Tex.).

The carrier cushion layer may also include materials such as antistats, colorants, antihalation dyes, optical brighteners, surfactants, plasticizers, coating aids, matting agents, and the like. In general, these additional materials may constitute less than about 10% by weight, based on the total weight of the carrier cushion layer; preferably less than about 5% by weight. It can be advantageous to include a white pigment in the carrier cushion layer. This facilitates inspection of the colored image formed thereon.

The carrier cushion layer generally has a thickness in the range of about 12 to 150 micrometers (0.5 to 6 mils); preferably 35 to 65 micrometers (1.4 to 2.6 mils).

The carrier element may also be provided with a temporary coversheet (not shown). The temporary coversheet can comprise any material which affords adequate protection of the underlying adhesive layer and which cleanly releases from the adhesive layer by peeling. Preferred coversheets are self releasing films, such as polyethylene or polyethylene terephthalate. These films can be coated with release layers, such as silicone, so long as the release layer is removed cleanly with the film. The thickness of the temporary coversheet is not critical and typically is in the range of 25 to 250 micrometers (1 to 10 mils).

Unpigmented Photosensitive Layer:

The photosensitive layer (11) comprises an aqueous liquid developable photosensitive composition which, upon exposure to actinic radiation, results in a change in solubility. The photosensitive composition can be photoinsolubilizable, i.e., before exposure the photosensitive composition is removable from the carrier support by water or by aqueous solutions that consist essentially of water. After exposure, the composition is not removable from the carrier support by water or by aqueous solutions that consist essentially of water. Alternatively, the photosensitive composition can be photosolubilizable. In this latter case, before exposure the photosensitive composition is not removable from the support by water or by aqueous solutions that consist essentially of water. After exposure, the composition is removable from the support by water or by aqueous solutions that consist essentially of water.

Photoinsolubilization is generally achieved by photoinitiated polymerization and/or crosslinking reactions. The resulting change in physical properties of the compounds present, particularly the increase in molecular weight and/or network formation, insolubilizes the photosensitive material.

Derivatives of water soluble polymers, such as polyvinyl alcohol, which comprise pendant photocrosslinkable groups can be used to advantage in the photosensitive layer. On exposure these groups react to form crosslinks between different polymer chains. Photocrosslinkable polymers are described in A. Reiser, *Photoreactive Polymers: The Science and Technology of Resists,* Wiley, New York, 1989, pp 24–32. Typical photocrosslinkable groups are, for example, the cinnamyl, chalcone, alpha-phenylmaleimide, N-alkyl styrylpyridinium, and N-alkyl styrylquinolinium groups. Other aqueous developable systems are disclosed in Briney et al., U.S. Pat. No. 4,485,167 issued Nov. 27, 1984.

Derivatives of polyvinyl alcohol which comprise photocrosslinkable groups are preferred. Preferred polyvinyl alcohol derivatives are those which comprise N-alkyl styrylpyridinium or N-alkyl styrylquinolinium groups.. Such polymers are described in K. Ichimura and S. Wantanabe, *J. Polym, Sci., Polym. Lett. Ed.,* 18, 613 (1980) and 20, 1411, 1419 (1982) as well as in Ichimura, U.S. Pat. Nos. 4,272,620, 4,287,335, 4,339,524, 4,564,580 and 4,777,114. The disclosure of these references is incorporated herein by reference.

Substituted aqueous-processable polyvinyl alcohol polymers are typically prepared by derivatization of saponified polyvinyl acetate with the appropriate photo-crosslinking group. It is desirable for the polyvinyl acetate to be at least 70% hydrolyzed. Typically 88% saponified polyvinyl acetate is used, but polyvinyl acetate which is more or less highly saponified can be used provided the photosensitive layer is aqueous-processable. The photocrosslinkable group can be attached to the polyvinyl alcohol by any appropriate chemical linkage, such as an ester, ether, or acetal linkage. The acetal linkage is preferred. Typically the 0.5–10 mol % photocrosslinkable groups, preferably 1–4 mol %, are present. Although polymers containing higher amounts of photocrosslinkable groups typically cannot be made to be aqueous-processable, higher amounts of photocrosslinkable groups can be used, provided the photosensitive layer is aqueous-processable. The degree of polymerization of the polyvinyl alcohol, i.e., the number of monomer units in the polymer chain, is advantageously in the range of 400 to 3,000. When the polymerization degree is too low, the exposure time required for insolubilization is lengthened. When the polymerization degree is too large, the viscosity of solutions containing the polymer becomes so large that they are difficult to prepare and handle.

Another class of polyfunctional photoactivatable crosslinking agents are bis-azides. These compounds are typically aromatic bis-azides substituted with one or more ionic groups, such as sulfonate, carboxylate, sulfate, etc., to increase water solubility. Typical bis-azides are sodium 4,4'-diazidostilbene-2,2'-disulfonate, sodium 4,4'-diazidobenzalacetophenone-2-sulfonate, and sodium 4,4'-diazidostilbene-alphacarboxylate. A preferred bis-azide is sodium 4,4'-diazidostilbene-2,2'-disulfonate. As will be apparent to those skilled in the art, equivalent results may be obtained from the use of bis-azides which contain other cations in place of sodium, such as, for example, potassium, ammonium, and substituted ammonium, such as, for example, ethyl ammonium, tetramethyl ammonium, etc.

Photosensitive diazo resins are another class of photosensitive materials. These materials typically consist of aromatic diazonium salts crosslinked with formaldehyde. Representative materials are: the zinc chloride complex of the 4-(phenylamino)-benzenediazonium sulfate (1:1) formaldehyde polymer, the zinc chloride complex of the 4-(phenylamino)-benzenediazonium phosphate (1:1) formaldehyde polymer, the cobalt chloride complex of the 4-(phenylamino)-benzenediazonium (1:1) formaldehyde polymer, the uncomplexed 4-(phenylamino)-benzenediazonium phosphate (1:1) formaldehyde polymer, and the uncomplexed 4-(phenylamino)-benzenediazonium sulfate (1:1) formaldehyde polymer. Since their development does not produce effluent containing heavy metals, the uncomplexed 4-(phenylamino)-benzenediazonium phosphate (1:1) formaldehyde polymer and the uncomplexed 4-(phenylamino)-benzenediazonium sulfate (1:1) formaldehyde polymer are preferred.

Photosolubilization is generally achieved by photoinitiated conversion of materials to more soluble forms, plasticization reactions, depolymerization, uncoupling or uncrosslinking reactions. Systems based on o-quinone diazides and low molecular weight phenol-formaldehyde polymers can be used to advantage. Upon exposure to ultraviolet radiation, the o-quinone diazide is converted to the readily dissolved indene carboxylic acid. A discussion of such systems can be found in A. Reiser, *Photoreactive Polymers: The Science and Technology of Resists,* Wiley, New York, 1989, pp 178–225. Useful photosolubilization chemistry is also disclosed in Chen et al., U.S. Pat. No. 5,071,731.

Other conventional additives can also be added to the photosensitive layer provided they are compatible with the other ingredients present in the layer, do not impart unwanted color to the final image, and do not adversely affect the action of the element required for the operation of the imaging process. In some cases separate photoinitiators are added. Other components can include, for example, polymeric binders, plasticizers, antihalation agents, optical brightening agents, release agents, surfactants, coating aids, matting agents, and the like.

Additives may be included in the photosensitive composition to improve the aqueous permeable, colorant-containing composition's penetration, absorption and/or fixation to the photosensitive layer. Matting agents added to the unpigmented photosensitive layer would be expected to provide a matte appearance to the layer and may also provide improved diffusibility of the colorant-containing composition into the unpigmented photosensitive layer The photosensitive material must be present in sufficient amount to solubilize or insolubilize the photosensitive layer on exposure to actinic radiation. The photosensitive composition must contain sufficient polymer, either as part of the photosensitive material and/or as added binder, to form a film when coated to form the photosensitive layer. Other ingredients may be present in amounts necessary to achieve their desired purposes, but not in such large amounts that they adversely affect the properties of the imaging system.

The composition of the photosensitive layer, expressed in percent by weight, based on the total weight of the photosensitive layer, may be typically: binder 80–98%, preferably 85–96%; photosensitive material 2–10%, preferably 2–6% and other ingredients 0≧10%. If no binder is present, i.e., the photosensitive material also functions as a binder, the composition may be typically: photosensitive material 80–100%, preferably 90–100%; and other ingredients 0–20%.

The photosensitive layer generally has a thickness in the range of 0.1 to 10 micrometers; preferably 0.5 to 2 micrometers.

Preparation of the Photosensitive Element:

The photosensitive element may be made by coating all of the layers, in order, onto the permanent carrier support using any conventional coating and/or lamination techniques. Such processes are well known in the art. If the anchor or adhesive layer is coatable from a non-aqueous solution, the layers may be coated on the temporary coversheet (not shown) and laminated to the permanent carrier support. If so, the temporary cover sheet may have a matte finish on its surface adjacent the photosensitive layer to impart a matte finish to the photosensitive layer when the temporary cover sheet is peeled off.

It is frequently convenient to prepare the photosensitive element by laminating together a preformed element to a permanent carrier element. The preformed element may comprise the photosensitive layer and the anchor or adhesive layer sandwiched between a temporary coversheet (not shown) and a temporary support (not shown). The anchor or adhesive layer (15) and the photosensitive layer (11) have the same composition as discussed above. Where the permanent carrier element is surface treated to improve adhesion, the preformed element may comprise a photosensitive layer sandwiched between a temporary coversheet (not shown) and a temporary support (not shown).

The optional temporary coversheet may be present to protect the element from being scratched or otherwise damaged prior to use. The temporary coversheet may be selected from the same materials described for the temporary coversheet in the carrier element.

The temporary support can comprise any dimensionally stable sheet material. Typically a polymeric film is used. The support should be removable from the photosensitive layer prior to exposure to actinic radiation. At the same time, there must be sufficient adhesion between the photosensitive layer and the temporary support to allow for manufacture and handling of the photosensitive element. A separate release layer can be situated between the temporary support and the photosensitive layer, or a silicone release-treated film can be used. It is preferred to use a release layer. This allows for adjustment of the adhesion force between the photosensitive layer and the temporary support with respect to the other important adhesion forces which influence the process of the invention, as will be discussed in detail below.

The thickness of the temporary support must be sufficient to impart the necessary stiffness for handling and dimensional stability, but beyond that it is not particularly critical. The thickness is generally in the range of 25 to 250 micrometers (1 to 10 mils).

Preferably, the element having a temporary support and a temporary coversheet is prepared by coating each of the individual layers onto the temporary support. Preferably, the photosensitive layer is prepared by suspending or dissolving the ingredients in an appropriate solvent, preferably aqueous; coating onto the temporary support; and evaporating the solvent.

The photosensitive element shown in FIG. 1 may be prepared from the preformed element and the permanent carrier element, by peeling off the cover sheet, laminating the two together such that the adhesive layer (15) is adjacent to the permanent carrier support (14), peeling off the temporary support and applying the aqueous permeable colorant containing composition to the unpigmented photosensitive layer. The temperature and pressure used in the lamination step will depend on the composition of the adhesive layer (15) and the permanent carrier support (14). When a release layer is present between the temporary support and the photosensitive layer, the release layer will be peeled off with the temporary support and will not remain on the photosensitive layer.

It will be clear to those skilled in the art that in order to remove the two temporary coversheets, the adhesion force between each of the temporary coversheets and their adjacent layers must be lower than the adhesion forces between all the other layers in their respective elements. It will also be clear that in order to remove the temporary support and the associated release layer, if present, after the lamination step, the adhesion force between the photosensitive layer and the temporary support or the release layer, if present, must be lower than the adhesion force between the photosensitive layer (11) and the anchor or adhesive layer (15), if present, and the adhesion force between the anchor or adhesive layer (15) and the permanent carrier support (14). If the carrier element is treated to improve adhesion and the preformed element does not have an anchor layer, then after the lamination step, the adhesion force between the photosensitive layer and the temporary support or the release layer, if present, must be lower than the adhesion force between the photosensitive layer (11) and the permanent carrier element (10).

COLORANT-CONTAINING COMPOSITION

The aqueous permeable colorant-containing composition (12) is applied to the unpigmented photosensitive layer of the photosensitive element. It may be applied as a layer or may be absorbed into the photosensitive layer after its application. The colorant-containing composition (12) has to be aqueous permeable so as not to interfere with the development of the photosensitive layer after exposure. If present as a layer over the unpigmented photosensitive layer its thickness should be no greater than 4 micrometers, preferably no greater than 2 micrometers. The colorant may be any material that is insoluble in the aqueous liquid used to develop the exposed, unpigmented photosensitive layer. It may be one of the four standard colors, i.e., yellow, magenta, cyan, and black, or any other desired color. The colorants which can be used are well known to those skilled in the art. The colorant should be compatible with the photosensitive layer and preferably should not strongly absorb radiation in the spectral range in which the photosensitive composition absorbs radiation. Preferred colorants are pigments which are dispersible in water.

The colorant must be present in a sufficient amount to uniformly color the image to a sufficient optical density, but not in such a large amount that if it were absorbed into the photosensitive layer after its application would adversely affect the properties of the photosensitive layer, for example, photospeed, adhesion, etc., needed for the operation of the imaging system. Optical densities between 0.5 and 2 are desirable. Other ingredients may be included in the colorant-containing composition to improve its penetration, absorption and or fixation to the photosensitive layer provided they do not adversely affect the photosensitive layer's imaging function or the colorant's desired color. Water insoluble binders may be present in the aqueous permeable colorant-containing composition to improve coatability and/or waterfastness of the image.

The aqueous permeable colorant-containing composition (12) which typically comprises a colorant and water may be coated, laminated, sprayed or printed onto the unpigmented photosensitive layer. In a preferred embodiment, the aqueous permeable colorant-containing composition (12) is an ink jet ink and is applied using an ink jet printer. The ink jet ink comprises an aqueous carrier medium and a colorant which may be a pigment dispersion or a dye. If the colorant is a dye, it must be rendered insoluble by known techniques, e.g. encapsulation, so it is not washed away in the development step. Reactive dyes that are capable of reacting with the photosensitive material upon exposure to UV radiation are also useful in this invention. Disperse dyes may also be used. The pigment dispersion comprises a pigment and a dispersing agent, which preferably is a polymeric compound.

Ink Jet Ink

The aqueous permeable colorant-containing composition (12) which may be applied as an ink jet ink, comprises an aqueous carrier medium and a colorant which may be a pigment dispersion or a dye.

Aqueous Carrier Medium:

The aqueous carrier medium is water or a mixture of water and at least one water-soluble organic component. Deionized water is commonly used. Representative examples of water-soluble organic solvents are disclosed in Ma et al, U.S. Pat. No. 5,085,698, the disclosure of which is incorporated herein by reference. Selection of a suitable mixture of water and water-soluble organic solvent depends upon requirements of the specific application, such as desired surface tension and viscosity, the selected pigment, drying time of the pigmented ink jet ink, and the type of photosensitive layer onto which the ink will be printed. A mixture of a water-soluble organic solvent having at least 2 hydroxyl groups, e.g. diethylene glycol, and deionized water is preferred as the aqueous medium. In the case of a mixture of water and diethylene glycol, water could be present in the amount of between 30% and 95%, preferably 60% to 95%, by weight based on the total weight of the aqueous carrier medium.

Colorant

The colorant useful in the invention may be a pigment dispersion or a dye. A pigment is a colorant that is applied in an insoluble particulate state. A dye is a colorant that is typically in a soluble state but will be insolubilized by known techniques such as encapsulation prior to use in this invention. Reactive dyes that are capable of reacting with the photosensitive material upon exposure to UV radiation are also useful in this invention. Disperse dyes may also be used. The term pigment dispersion, as is known in the art and as used herein, refers to a mixture of a pigment and a dispersing agent. Preferably, the dispersing agent is a polymeric compound.

Pigments:

Useful pigments for the dispersion comprise a wide variety of organic and inorganic pigments, alone or in combination. For ink jet ink applications, the pigment particles need to be sufficiently small to permit free flow of the ink through the ink jet printing device, especially at the ejecting nozzles that usually have a diameter ranging from 10 to 50 microns. The particle size also has an influence on the pigment dispersion stability, which is critical throughout the life of the ink. Brownian motion of minute particles will help prevent the particles from flocculation. It is also desirable to use small particles for maximum color strength and gloss. The range of useful particle size is approximately 0.005 to 15 microns. Preferably, the pigment particle size should range from 0.005 to 1 micron.

The selected pigment may be used in dry or wet form such as presscake. Representative commercial dry and presscake pigment that may be used in practicing the invention are disclosed by Ma et al. in U.S. Pat. No. 5,085,698, which is incorporated herein by reference.

In the case of organic pigments, the ink may contain up to approximately 30% pigment by weight, but will generally be in the range of approximately 0.1 to 15%, preferably approximately 0.1 to 5%, by weight of the total ink composition. If an inorganic pigment is selected, the ink will tend to contain higher weight percentages of pigment because inorganic pigments generally have higher specific gravities than organic pigments.

Dispersant:

Polymeric dispersants are the preferred dispersants for pigments. Polymeric dispersants suitable for practicing this invention include random copolymers, block copolymers such as AB, BAB, and ABC block copolymers, and graft copolymers.

In AB or BAB block copolymers, the A block is a hydrophobic homopolymer or copolymer which serves to link with the pigment and the B block is a hydrophilic homopolymer or copolymer, or salts thereof, which serves to disperse the pigment in the aqueous medium. Such polymeric dispersants and their synthesis are disclosed in Ma et al., U.S. Pat. No. 5,085,698, issued Feb. 4, 1992, the disclosure of which is incorporated herein by reference.

ABC triblock copolymers are also useful as pigment dispersants. In the ABC triblock copolymer, the A block is a polymer soluble in water, the B block is capable of binding to the pigment, and the C block is compatible with the organic components in the ink. ABC triblock copolymers and their synthesis are disclosed in Ma et al., U.S. Ser. No.

07/838,181 filed Feb. 20, 1992, the disclosure of which is incorporated herein by reference.

Although random copolymers can be used as dispersing agents, they are not as effective in stabilizing pigment dispersions as the block copolymers, and therefore are not preferred.

Dyes:

Dyes which are commonly used in aqueous ink jet inks, such as, for example, acid dyes, basic dyes, direct dyes, food dyes, and reactive dyes are suitable colorants for the ink compositions of the present invention provided they are rendered insoluble by techniques known to those skilled in the art, e.g. encapsulation. Disperse dyes may also be suitable as colorants.

The color and amount of dye used in the ink are largely a function of choice, being primarily dependent upon the desired color of the print achieved with the ink and the dye's strength. Low concentrations of dyes may not give adequate color vividness. High concentrations may result in poor printhead performance or unacceptably dark colors.

The dye may be present in the amount of 0.01 to 20%, by weight, preferably 0.05 to 8%, by weight, more preferably 1 to 5% by weight, based on the total weight of the ink.

Other Ingredients:

Any material that would provide swelling of the photosensitive layer without having a deleterious effect on it would be useful for improving diffusibility of the ink into the photosensitive layer, e.g. water, surfactants, etc. Surfactants alter surface tension and would therefore be expected to maximize penetration of the ink into the photosensitive layer. However, they may also destabilize the pigment dispersion for pigmented inks. The choice of a specific surfactant is also highly dependent on the type of photosensitive layer in the photosensitive element to be printed. It is expected that one skilled in the art can select the appropriate surfactant and the appropriate amount for a specific element to be printed. Thermal crosslinking agents may be added to the ink or the photosensitive layer to improve adhesion of the ink to the photosensitive layer and prevent it from being washed off during the development step.

Biocides, sequestering agents such as EDTA, humectants, viscosity modifiers, and other acrylic or non-acrylic polymers may also be added to improve various properties of the inks.

Ink Preparation and Ink Properties:

The aqueous permeable, colorant-containing ink compositions of the invention are prepared as described in Ma et al., U.S. Pat. No. 5,085,692 issued Feb. 4, 1992.

Jet velocity, separation length of the droplets, drop size, and stream stability are greatly affected by the surface tension and the viscosity of the ink. Inks suitable for use with ink jet printing systems should have a surface tension in the range of about 20 dyne/cm to about 70 dyne/cm and, more preferably, in the range of 25 dyne/cm to about 70 dyne/cm at 20° C. Acceptable viscosities are no greater than 20 cP, and preferably below 10 cP at 20° C. The ink has physical properties compatible with a wide range of ejecting conditions, i.e., driving voltage, driving frequency, and pulse width for thermal ink jet printing devices, driving frequency for the piezo element for either a drop-on-demand device or a continuous device, and the shape and size of the nozzles, etc. They may be used with a variety of ink jet printers such as continuous, piezoelectric drop-on-demand, and thermal drop-on-demand, and are particularly adapted for use in thermal ink jet printers. The inks have excellent storage stability for a long period and do not clog the nozzles. Drying of the ink on the photosensitive layer can be carried out rapidly and accurately by means known to those skilled in the art.

PROCESS STEPS

The process of the invention may be used to produce a single color image on a permanent support or it may be used to make a multicolor image on a permanent support. A single color image formed on a transparent permanent carrier element can then be used to prepare a multicolor overlay proof.

Single Color Image:

In the process of producing a single color image on a permanent support, the colored image is built up on the permanent carrier element by exposing and developing by washout an unpigmented photosensitive layer (11) having thereon at least one aqueous permeable, colorant-containing composition (12). The permanent carrier element may be treated for improved adhesion or comprise a carrier support (14) and an anchor or adhesive layer (15) which would be present between the unpigmented photosensitive layer (11) and the permanent carrier support (14).

Step A: The element shown in FIG. 1 is prepared by applying at least one aqueous permeable, colorant-containing composition (12) to a photosensitive element comprising, in order, a permanent carrier element having a carrier surface (10), a first photosensitive layer (11), wherein the colorant-containing composition is adjacent to the first photosensitive layer (11). The colorant-containing composition (12) may be applied by coating, spraying, laminating or printing. Preferably, the composition (12) is printed using an ink jet printer. Advantages of the invention are that the colorant-containing composition need not be applied to the whole surface of the first photosensitive layer and more than one colorant-containing composition can be applied to the first photosensitive layer. The colorant-containing composition need only be approximately applied in areas where an image is to be formed in Steps B and C.

Step B: The element shown in FIG. 1 is exposed to actinic radiation which is absorbed by the photosensitive composition to activate the imaging reaction in conventional fashion. "Actinic radiation" is any radiation which produces imaging. The radiation can be natural or artificial, monochromatic or polychromatic, incoherent or coherent. For efficient image formation, most of the actinic radiation should be absorbed by the photosensitive material. The absorption spectrum of the photosensitive material may be determined by conventional spectrophotometry.

Conventional sources of actinic radiation that may be selected include fluorescent, mercury vapor, mercury-xenon, metal additive, and arc lamps. Useful sources of coherent radiation, such as lasers whose emissions fall within or overlap the absorption bands of the photosensitive composition, may also be used. Exposure is ordinarily carried out through a halftone image-bearing transparency, preferably a halftone color separation transparency. However, other means, such as a modulated scanning laser beam, CRT (cathode ray tube), and the like, may be used to imagewise expose the photosensitive elements.

The element is exposed to actinic radiation, typically through a separation transparency with the emulsion side of the transparency in contact with the photosensitive layer. Exposure is conveniently carried out in a standard vacuum frame to ensure good contact between the transparency and the photosensitive layer with its overlying aqueous permeable, colorant-containing composition.

Step C: The next step is to develop the unpigmented photosensitive layer and its overlying aqueous permeable, colorant-containing composition by washing with an aqueous liquid. When the photosensitive layer is photoinsolubilizable, the aqueous liquid removes only the unexposed areas of the photosensitive layer and its overlying aqueous permeable, colorant-containing composition. When the photosensitive layer is photosolubilizable, the aqueous liquid removes only the exposed areas of the photosensitive layer and its overlying aqueous permeable, colorant-containing composition. As a result of the development step, a first colored pattern comprised of (11') and (12') is formed.

It is preferred that the development step be effected using ordinary tap water or the like to minimize concerns regarding toxicity, waste treatment, and corrosion. Development can either be done manually or using automated machines. It can be carried out at elevated temperatures, but in most cases, room temperature is preferred.

Figure 3:
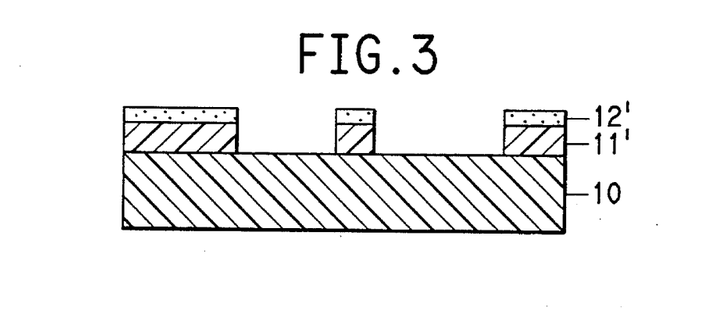
FIG. 3 is a schematic illustration of one embodiment of a single color image prepared using the process of the invention and useful in preparing a multicolor overlay.
Figure 4:
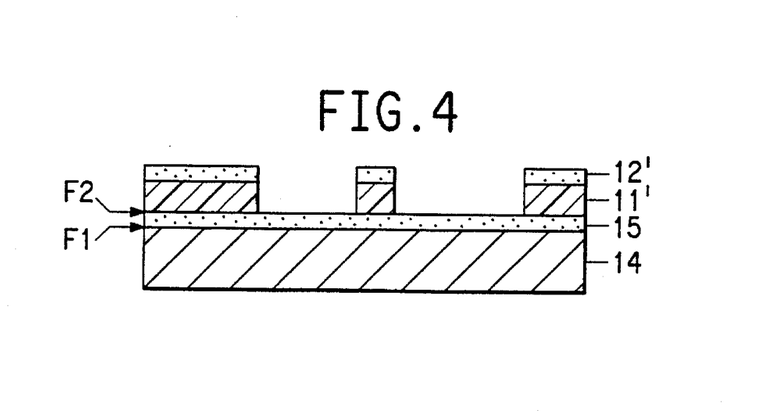
FIG. 4 is a schematic illustration of a different embodiment of a single image on a permanent carrier element prepared using the process of the invention or useful in a multicolor overlay.

In FIG. 3, the permanent carrier element (10) has been surface treated for improved adhesion. In FIG. 4, a separate anchor or adhesive layer (15) is present on the permanent carrier support (14). The adhesion force between the permanent carrier support (14) and the anchor or adhesive layer (15) is F1, and tire adhesion force between the a first colored pattern comprised of (11') and (12') and the anchor or adhesive layer (15) is F2.

Multicolor Image Formation:

When at least two single color images on a transparent, permanent carrier element are stacked over each other, an overlay multicolor image is obtained. When an image having more than one color is to be formed as a surprint, the process begins with steps A through C as described above, to form a first colored pattern. This is followed by steps C1 through C6.

Figure 5:
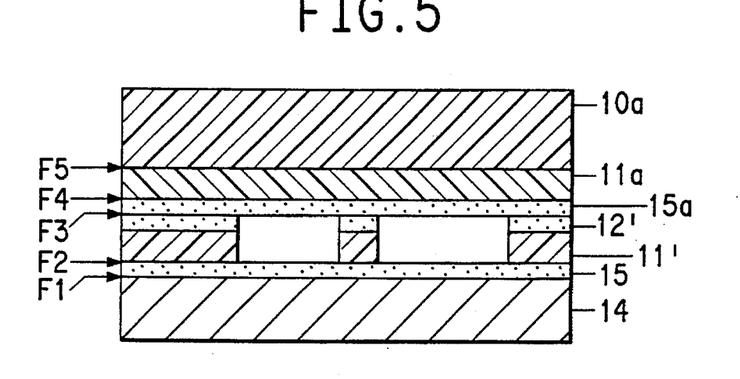
FIG. 5 is a schematic illustration showing an additional photosensitive element having in order, an adhesive layer, a photosensitive layer and an overlying support present on the first colored pattern containing element after step (C) using the process of the invention.

Step C1: The next step in the process of forming a multicolor image is to laminate an additional unpigmented photosensitive element to the developed element from step C above. The additional element as shown in FIG. 5, has an additional support (10a), an underlying additional photosensitive layer (11a), and an underlying additional adhesive or anchor layer (15a) which is adjacent to and overlying the first colored pattern comprised of the aqueous colorant containing composition (12') and the underlying exposed and undeveloped areas of the photosensitive layer (11').

The adhesion forces between the layers have the values F1 and F2 as defined above, and in addition:

F3=the adhesion force between the first colored pattern comprised of (11') and (12') and the overlying additional adhesive or anchor layer (15a).

F4=the adhesion force between the additional adhesive or anchor layer (15a) and the overlying additional photosensitive layer (11a) prior to exposure to actinic light.

F5=the adhesion force between the additional photosensitive layer (11a) prior to exposure to actinic light and the overlying additional support (10a).

Step C2: The additional support (10a) is removed from the additional photosensitive layer (11a). In order to obtain the desired result, the adhesion values F1, F2, F3, and F4, must each individually be greater than the adhesion value F5.

Figure 6:
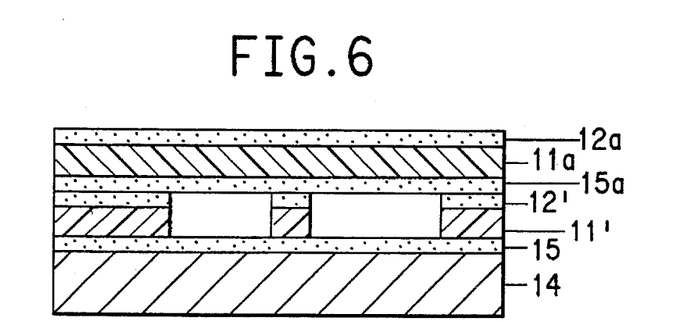
FIG. 6 is a schematic illustration showing the first colored pattern containing element after step (C) having in order, an adhesive layer, a photosensitive layer and a aqueous permeable colorant-containing composition present on it using the process of the invention.

Step C3: As shown in FIG. 6 at least one additional aqueous permeable, colorant containing composition (12a) is then applied to the additional photosensitive layer (11a).

Step C4: The next step in the process is to imagewise expose the additional photosensitive layer (11a) with its overlying additional aqueous permeable, colorant containing composition (12a) in register with the first colored pattern comprised of (11') and (12'). Suitable registration techniques are well known in the art and include pin and bar registration. The exposure is carried out as described in Step B.

Step C5: The next step in the process is to develop the element from step C4 using aqueous washout development as described in step C. This results in the formation of a second colored pattern comprised of (11a') and (12a').

Figure 7:
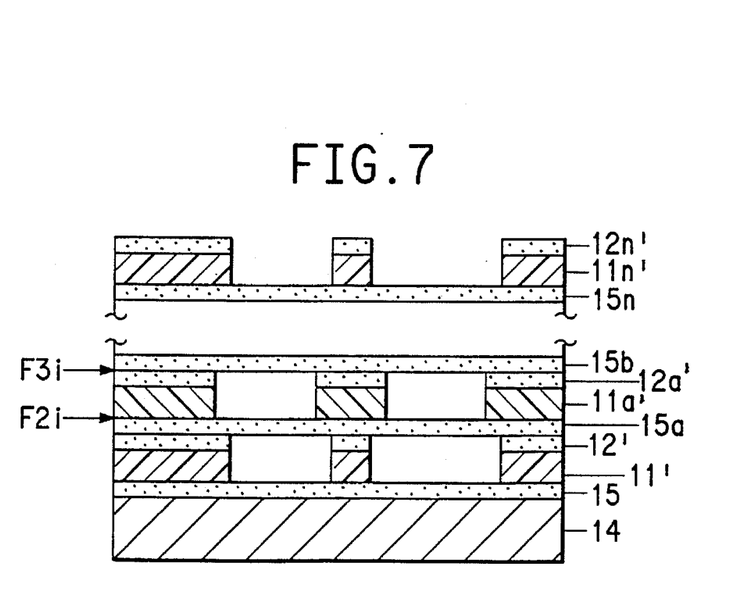
FIG. 7 is a schematic illustration of a multicolor imaged element on a permanent carrier element or support using the process of the invention.

Step C6: Steps C1 to C5 are repeated in order, one or more times to provide additional colors to the image. These steps are carried out using additional unpigmented elements and additional aqueous permeable, colorant containing compositions. The unpigmented element has an additional adhesive layer (15b) and colored pattern (not shown), through the nth element having an additional adhesive layer (15n) and an overlying colored pattern comprised of (11n') and (12n') as shown in FIG. 7. In each lamination step the unpigmented photosensitive element element described in Step C1 is laminated to the element from Step C5 such that the additional adhesive layer is adjacent to and overlying the outermost colored pattern. It will be appreciated that for each repetition of Step C3 in which the additional temporary support is removed, the adhesion force between the additional temporary support and the underlying unexposed additional photosensitive layer is less than the adhesion forces between all of the other layers in the element.

The adhesion forces between the layers have the values F1, F2, F3, F4 and F5 as defined above, and in addition:

F2i=the adhesion force between the additional adhesive layer (15a) and the overlying additional color pattern comprised of (11a') and (12a').

F3i=the adhesion force between the additional colored pattern comprised of (11a') and (12a') and the overlying additional adhesive layer (15b).

In most cases, the same photosensitive composition will be used for all the photosensitive layers, and the same adhesive composition will be used for all the adhesive layers.

INDUSTRIAL APPLICABILITY

The elements of this invention are useful for preparing colored images. These images are particularly useful in the graphic arts field, especially in the area of color proofing wherein proofs are prepared to predict the images produced by printing.

The advantageous properties of this invention can be observed by reference to the following examples which illustrate, but do not limit, the invention.

EXAMPLES

| GLOSSARY | |
|---|---|
| Denka ® LAC TL-03 | Vinyl chloride/vinyl acetate copolymer; Denki Kagaku Kogyo Kabushiki Kaisha, Japan |
| Dryer 900 | P-Toluenesulfonic acid |
| Mizukasil ® SK7 | Silica particles, Mizusawa Industrial Chemicals. Japan |
| Ryuron ® QU-628 | Vinyl chloride/vinyl propionate/vinyl acetate/methyl methacrylate copolymer; Tosoh Corporation, Japan |
| SPP M-20 | Polyvinyl alcohol acetalized with N-methyl-4-(p-formyl styryl)pyridinium methosulfate; Toyo Gosei Kogyo Co., LTD., Japan |
| Sunsperse ® Black LHD-9303 | Aqueous pigment dispersion; Sun Chemical, Dispersions Div., Amelia, OH |
| Sunsperse ® Blue | Aqueous pigment dispersion; |

GLOSSARY -continued

| | |
|---|---|
| BHD-6000 | Sun Chemical, Dispersions Div.,Amelia, OH |
| Sunsperse ® Blue BHD-6015 | Aqueous pigment dispersion; Sun Chemical, Dispersions Div., Amelia, OH |
| Sunsperse ® Magenta QHD-6040 | Aqueous pigment dispersion; Sun Chemical, Dispersions Div., Amelia, OH |
| Sunsperse ® Yellow YHD-9439 | Aqueous pigment dispersion; Sun Chemical, Dispersions Div., Amelia, OH |
| Tispeel XA51-824A | Melamine acrylic resin; Hitachi Kasei Polymer, Japan |
| Vylonal MD | Heat sealable polyester resin emulsions; Toyobo Co., Japan |
| Zonyl ® FSO-100 | Perfluoroalkyl surfactant; DuPont, Wilmington, DE |
| UGRA test strip | Dot range 0.5%–99.5% dots, Graphic Arts Technical Foundation, Pittsburgh, PA. |

Example 1

Photosensitive Element: A photosensitive film element having the following structure was used to make a four-color proof: (1) an approximately 1 micron photosensitive layer, (2) a 1 micron adhesive layer, and (3) a 2-mil polyethylene terephthalate support. The photosensitive layer was comprised of SPP M-20. The adhesive layer contained a 30:70 mixture of Vylonal MD-1400 and Vylonal MD-1100.

Process Steps:

Step 1. Four separate photosensitive elements were "inked" to form an ink layer by individually coating yellow, magenta, cyan and black solutions onto separate photosensitive layers using a wire-wound rod.

Yellow Solution; 1 g Sunsperse® Yellow YHD-9439, 49 g water and 0.03 g Zonyl® FSO-100

Magenta Solution: 2 g Sunsperse® Magenta QHD-6040, 48 g water and 0.03 g Zonyl® FSO-100

Cyan Solution: 1 g Sunsperse® Blue BHD-6000,49 g water and 0.03 g Zonyl®FSO-100

Black Solution: 1 g Sunsperse® Black LHD-9303,49 g water and 0.03 g Zonyl® FSO-100

Step 2. The inked photosensitive elements were placed in a vacuum frame with the ink layer up, i.e., facing the source of actinic radiation. An appropriate negative separation transparency for each color was placed on top of the ink layer with the emulsion side of the transparency in contact with the ink layer and the base side up. A vacuum was drawn on the element and separation transparency for about 90 sec prior to exposure. The elements were exposed for about 10 sec (magenta) and 20 sec (yellow, cyan, and black) with radiation from a 5 kW high pressure mercury vapor lamp (Olec L1261 lamp, Olec Olix AL985 Integrator, and Olite AL53-100 power supply, Olec, Inc., Irvine, Calif.) positioned about 137 cm above the element and separation transparency. After exposure, the separation transparencies were removed from the exposed photosensitive elements.

Step 3. The elements were then developed using a Water-Proof® WashOff Unit which utilized a water stream and rotating brush to remove the non-exposed areas of the photosensitive and ink layers. The elements were then dried in this unit at a temperature of about 38° C.

Step 4. The imaged elements were then registered one to another over a white support (LOE paper stock) to obtain a multicolor overlay proof. Proof image results are shown in Table 1.

TABLE 1

| Color | Color Density | UGRA % Dots | UGRA Resolution (μ) |
|---|---|---|---|
| Yellow | 0.80 | 1–97 | 15 |
| Magenta | 1.26 | 0.5–99.5 | 6 |
| Cyan | 1.70 | 0.5–99.5 | 8 |
| Black | 0.33 | 2–98 | 20 |

Example 2

Example 1 was repeated with the following differences:

Step 1. A photosensitive element similar to that described in Example 1 but having a 4-mil support was "inked" using a Hewlett Packard Desk Jet 550C ink jet printer. Three approximately 1"×7"(2.54×17.78 cm) single-color, solid ink strips of cyan, magenta and yellow inks were printed onto the photosensitive layer.

The inks used had the following compositions and were prepared using a procedure similar to that described in Example 1 of U.S. Pat. No. 5,310,778 issued May 10, 1994:

| Cyan Ink: INGREDIENT | AMOUNT (%) |
|---|---|
| Monolite ® Green 751 pigment, Zeneca, Inc., Wilmington, DE. | 0.83 |
| Endurophthal ® Blue GF, Cookson Pigments, Inc., Newark, NJ. | 1.67 |
| Butyl methacrylate/methyl methacrylate// methacrylic acid, (BMA/MMA//MAA) (10/5//10)[1] | 1.67 |
| Diethylene glycol | 5.70 |
| Liponics ® EG-1, Lipo Chemical Co.,Paterson, NJ. | 5.70 |
| N-methyl pyrrolidinone | 0.90 |
| Deionized water | 83.50 |

The ink had a pigment to binder ratio of 2:1.

| Magenta Ink: INGREDIENT | AMOUNT (%) |
|---|---|
| Quindo ® Magenta RV6803, Miles, Inc., Pittsburg, PA. | 2.175 |
| Indofast ® Brilliant Scarlet R6300, (Pigment Red 163, C.I. No. 71145), Miles, Inc., Pittsburg, PA. | 0.325 |
| Butyl methacrylate/methyl methacrylate// methacrylic acid, (MMA/MMA//MAA) (10/5//10)[1] | 1.67 |
| Diethylene glycol | 5.70 |
| Liponics ® EG-1, Lipo Chemical Co.,Paterson, NJ. | 5.70 |
| N-methyl pyrrolidinone | 0.90 |
| Deionized water | 83.53 |

The ink had a pigment to binder ratio of 1.5:1.

| Yellow Ink: INGREDIENT | AMOUNT (%) |
|---|---|
| Permanent Yellow GG pigment, Hoechst Celanese, Specialty Chemicals Group, Charlotte, NC. | 2.50 |
| Butyl methacrylate/methyl methacrylate// methacrylic acid, (BMA/MMA//MAA) (10/5//10)[1] | 1.67 |
| Diethylene glycol | 5.70 |
| Liponics ® EG-1, Lipo Chemical Co.,Paterson, N.J. | 5.70 |
| N-methyl pyrrolidinone | 0.90 |
| Deionized water | 83.53 |

The ink had a pigment to binder ratio of 1.5:1.

| Black Ink: INGREDIENT | AMOUNT (%) |
|---|---|
| FW18, carbon black pigment, Degussa Corp., Allendale, NJ. | 3.60 |
| Butyl methacrylate/methyl methacrylate// methacrylic acid, (BMA/MMA//MAA) (10/5//10)[1] | 1.80 |
| Diethylene glycol | 5.70 |
| Liponics ® EG-1, Lipo Chemical Co.,Paterson, N.J. | 5.70 |
| N-methyl pyrrolidinone | 0.90 |
| Deionized water | 82.30 |

[1]Polymer 3 in U.S. Pat. 5,310,778. Made as described therein.

The ink had a pigment to binder ratio of 2:1.

Step 2. The inked photosensitive elements were exposed for 50 sec. Proof image results are shown in Table 2.

TABLE 2

| Color | Color Density | UGRA % Dots | UGRA Resolution (μ) |
|---|---|---|---|
| Cyan | 0.51 | 2–98 | 8μ |
| Magenta | 0.29 | 2–99 | 6μ |
| Yellow | 0.30 | 5–97 | 20μ |

Example 3

Photosensitive Element:

A photosensitive film element having the following structure was used to make a four-color proof: (1) an approximately 1 micron adhesive layer (2) an approximately 1 micron photosensitive layer (3) an approximately 3 micron release layer (4) a 4-mil polyethylene terephthalate support. The adhesive layer was comprised of about 99.5 parts Vylonal MD-1400 and 0.5 parts Zonyl® FSO-100. The photosensitive layer was comprised of SPP M-20. The release layer was comprised of Tispeel XA51-824A (4.9 parts by weight), Ryuron® QU-628 (93.2 parts by weight), Mizukasil® SK7 (1.5 parts by weight), and Dryer 900 (0.4 parts by weight). The permanent support was 3M Matchprint® Base—Low Gain.

Process Steps:

Step 1. The photosensitive element was laminated to the permanent support with the adhesive layer in contact with the permanent support using a WaterProof® Laminator (100° C., 400 mm/min, 150 lbs). The photosensitive element support and release layer were then removed, effectively transferring the adhesive and photosensitive layers to the permanent support.

Step 2. The photosensitive layer was "inked" with the cyan solution as described in Example 1.

Step 3. The inked photosensitive layer was exposed for 40 sec through a negative cyan separation transparency and then developed as described in Steps 2 and 3 of Example 1. The result was a cyan color image on the permanent support.

Step 4. A second photosensitive element was laminated to the cyan image on the permanent support as described in Step 1, followed by removal of the photosensitive element support and release layer.

Step 5. The revealed second photosensitive layer was "inked" with the magenta solution as described in Example 1.

Step 6. The inked second photosensitive layer was exposed in register with the cyan image for 20 sec through a negative magenta separation transparency and then developed as described in Step 3.

Step 7. Third (yellow) and fourth (black) color images were added by repeating Steps 4–6 using the yellow and black ink solutions described in Example 1, with 40 and 20 sec exposures, respectively. The result was a four-color proof on a permanent support. Proof image results are shown in Table 3.

TABLE 3

| Color | Color Density | UGRA % Dots | UGRA Resolution (μ) |
|---|---|---|---|
| Cyan | 1.86 | 0.5–90 | 55 |
| Magenta | 1.21 | 0.5–98 | 15 |
| Yellow | 0.78 | 10–98 | 15 |
| Black | 0.46 | 2–95 | 20 |

What is claimed is:

1. A process for forming a colored image comprising, in order:
   (A) applying at least one aqueous-permeable, colorant-containing composition to a photosensitive element comprising, in order,
      (1) a permanent carrier element, that is resistant to aqueous liquid development,
      (2) a carrier surface selected from the group consisting of (i) a surface treated to promote adhesion, (ii) an anchor layer, and (iii) combinations thereof,
      (3) an unpigmented, first photosensitive layer consisting essentially of a photosensitive composition which is developable in aqueous liquid wherein an aqueous-permeable, colorant-containing layer formed by the application of the aqueous-permeable colorant composition is in contact with the first photosensitive layer;
   (B) imagewise exposing to actinic radiation the photosensitive element from step (A) having applied thereon the permeable, colorant-containing layer; and
   (C) developing the exposed element from step (B) by washing with an aqueous liquid which is selected from water or an aqueous solution that consists essentially of water, thereby removing either the imagewise exposed or imagewise unexposed regions of the unpigmented first photosensitive layer and its overlying aqueous-permeable, colorant-containing layer, to produce a first colored pattern.

2. The process of claim 1 wherein the permanent carrier element in the photosensitive element is transparent.

3. The process of claim 1 wherein the permanent carrier element in the photosensitive element is opaque.

4. The process of claim 3 additionally comprising, in order, following step (C):
   (C1) laminating to the element from step (C) an unpigmented element, said unpigmented element comprising,
      (1) an additional support,
      (2) an underlying additional photosensitive layer comprising,
         (a) at least one, unpigmented, photosensitive composition which is aqueous liquid developable, and
      (3) an underlying additional adhesive layer; wherein the additional adhesive layer is adjacent to and overlying the first colored pattern in the element from step (C);
   (C2) removing said additional support;
   (C3) applying at least one aqueous permeable colorant-containing composition to the additional photosensitive layer;

(C4) imagewise exposing to actinic radiation said additional photosensitive layer and the aqueous permeable colorant-containing composition in register with the previously formed first colored pattern to form imagewise exposed and imagewise unexposed regions;

(C5) developing said exposed additional photosensitive layer and the aqueous permeable colorant-containing composition from step (C4) by washing with an aqueous liquid, thereby removing either the imagewise exposed or imagewise unexposed regions, to produce an additional colored pattern; and optionally, (C6) repeating, in order, steps (C1) to (C5) one or more times; wherein the adhesion force between the permanent carrier element and said carrier surface has a value of F1; the adhesion force between said carrier surface and said first colored pattern has a value of F2; wherein the adhesion force between said adhesive layer and said underlying first colored pattern has the value F3; the adhesion force between any of said additional adhesive layers and the underlying additional colored pattern has the value F3i; the adhesion force between any of said additional adhesive layers and the overlying additional colored pattern has the value of F2i; the adhesion force between the additional adhesive layer and the overlying additional photosensitive layer prior to exposure to actinic light has the value F4; the adhesion force between the additional photosensitive layer prior to exposure to actinic light and the overlying additional support has the value F5; and wherein each of F1, F2, F3, F2i, F3i, and F4 is greater than 5.

5. The process of claim 1, 2, 3 or 4 wherein the carrier surface on the carrier element comprises an anchor layer, wherein the adhesion force between the carrier element and the carrier anchor layer is F1.

6. The process of claim 1, 2, 3 or 4 wherein the photosensitive composition comprises a material selected from the group consisting of N-alkyl styrylpyridinium derivatives of polyvinyl alcohol, N-alkyl styrylquinolinium derivatives of polyvinyl alcohol, and mixtures thereof.

7. The process of claim 1, 2, 3 or 4 wherein the anchor layer comprises a material selected from the group consisting of vinyl chloride/vinylacetate copolymers, ethylene/vinylacetate copolymers, polyesters, and mixtures thereof.

8. The process of claim 1, 2, 3 or 4 wherein the aqueous liquid is water.

9. The process of claim 1, 2, 3 or 4 wherein the aqueous permeable, colorant-containing composition is applied as a layer.

10. the process of claim 1, 2, 3 or 4 wherein the aqueous permeable colorant-containing composition is absorbed into the unpigmented first photosensitive layer.

11. The process of claim 1, 2, 3 or 4 wherein the aqueous permeable colorant-containing composition is printed on the unpigmented, first photosensitive layer using an ink jet printer.

12. The process of claim 11 wherein the aqueous permeable colorant-containing composition is an ink comprising an aqueous carrier medium and a colorant.

13. The process of claim 12 wherein the colorant is a pigment dispersion.

14. The process of claim 12 wherein the colorant is a dye.

15. The process of claim 9 wherein the surface of the layer of the aqueous permeable colorant-containing composition away from the unpigmented photosensitive layer is matte-finished.

16. The process of 10 wherein the surface of the unpigmented photosensitive layer having the aqueous permeable colorant-containing composition absorbed therein is matte-finished.

17. The process of claim 1, 2, 3 or 4 wherein the unpigmented photosensitive layer is matte-finished prior to application of the aqueous permeable colorant-containing composition.

* * * * *

UNITED STATES PATENT AND TRADEMARK OFFICE
Certificate

Patent No. 5,532,115                                                                              Patented: July 2, 1996

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Gregory A. Bodager, Monroeton, Pa.; Philip L. Beighle, Colts Neck, N.J.; and Daphne Pintor Fickes, Kennett Square, Pa.

Signed and Sealed this First Day of February, 2000.

MARIA NUZZOLILLO
                                                                                                    *SPE* Art Unit 1745